United States Patent
Worthen et al.

[11] Patent Number: 6,052,286
[45] Date of Patent: Apr. 18, 2000

[54] RESTRAINED CENTER CORE ANISOTROPICALLY CONDUCTIVE ADHESIVE

[75] Inventors: Karl L. Worthen; Leon Stiborek, both of Dallas, Tex.

[73] Assignee: Texas Instruments Incorporated, Dallas, Tex.

[21] Appl. No.: 09/057,357

[22] Filed: Apr. 8, 1998

[51] Int. Cl.[7] .................................................. H05K 1/03
[52] U.S. Cl. ........................ 361/765; 361/777; 361/783; 257/703; 257/720; 439/66; 439/91
[58] Field of Search .................................. 361/765, 777, 361/783, 769, 760; 439/66, 91; 257/703, 720

[56] References Cited

U.S. PATENT DOCUMENTS

| | | | |
|---|---|---|---|
| 5,019,944 | 5/1991 | Ishii et al. ................................ | 361/783 |
| 5,286,417 | 2/1994 | Mahmoud et al. ...................... | 252/518 |
| 5,431,571 | 7/1995 | Hanrahan et al. ....................... | 439/91 |
| 5,613,862 | 3/1997 | Naylor .................................... | 439/91 |
| 5,818,700 | 10/1998 | Purinton ................................. | 361/760 |

OTHER PUBLICATIONS

IBM Technical Disclosure Bulletin, vol. 30, No. 9, Feb. 1988.

*Primary Examiner*—Leo P. Picard
*Assistant Examiner*—David Foster
*Attorney, Agent, or Firm*—Gary C. Honeycutt

[57] ABSTRACT

A polymeric three-layer membrane having metal-filled microscopic pores extending through the complete thickness of the membrane, including a central restraining core layer, and an adhesive layer on each surface of the core layer. The membrane is used to form interconnects between electronic parts.

4 Claims, 3 Drawing Sheets

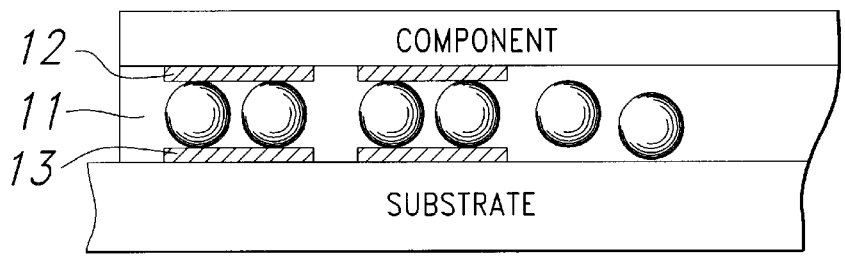
Fig. 1 PRIOR ART
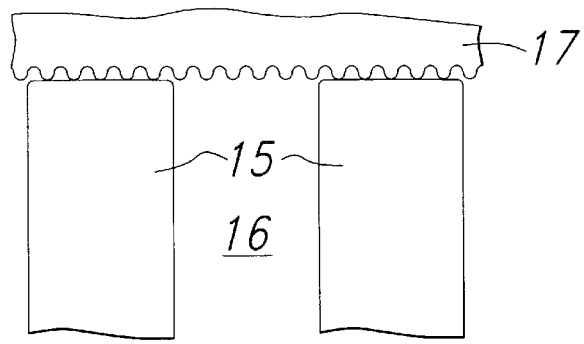
Fig. 2
Fig. 6
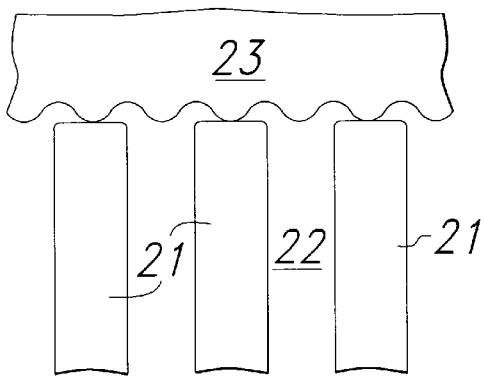
Fig. 3
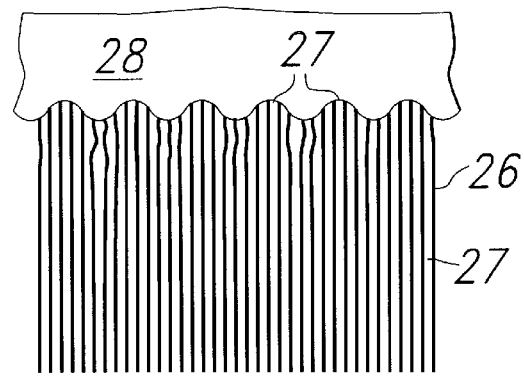
Fig. 4
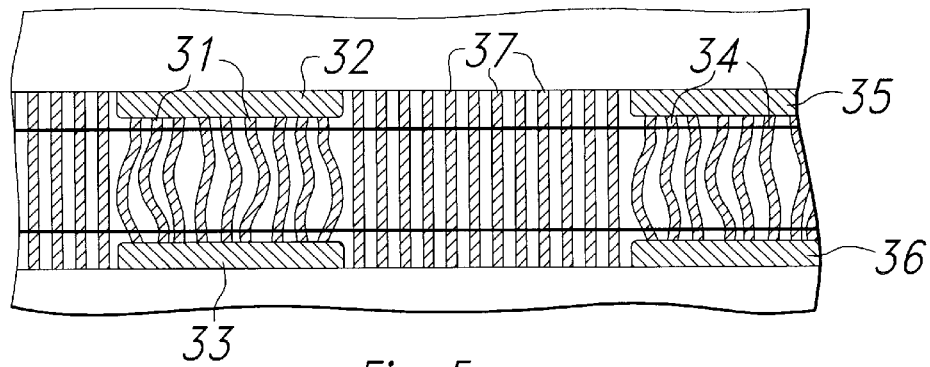
Fig. 5

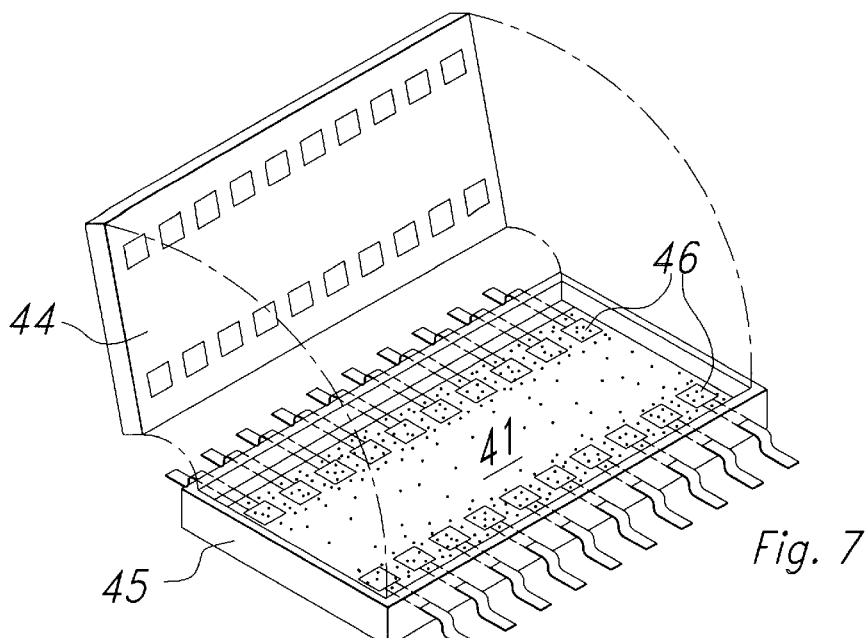
Fig. 7
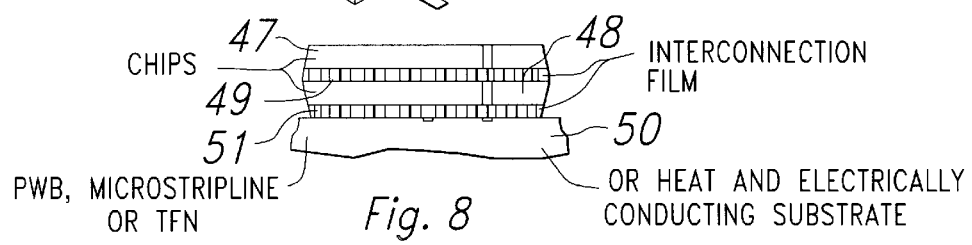
CHIPS 47  48 INTERCONNECTION FILM
49
51  50
PWB, MICROSTRIPLINE  OR HEAT AND ELECTRICALLY
OR TFN  Fig. 8  CONDUCTING SUBSTRATE
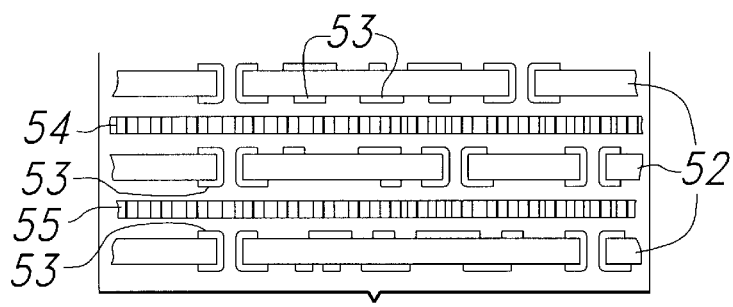
Fig. 9
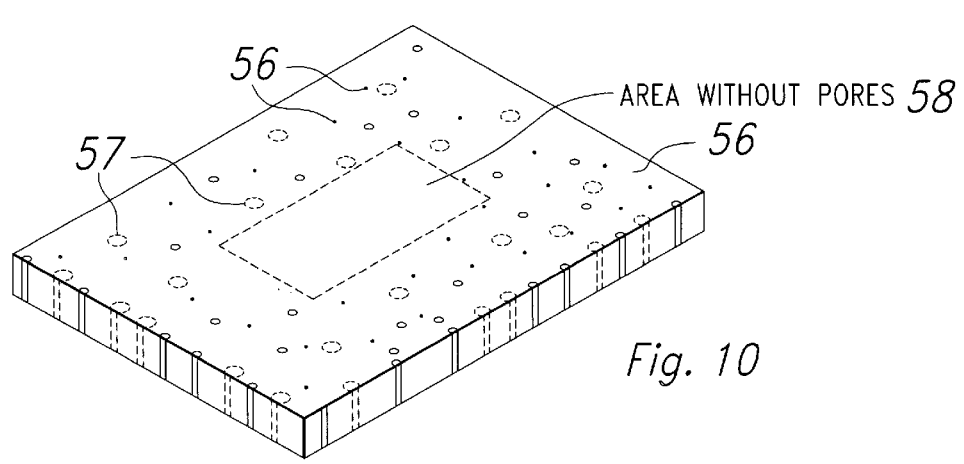
Fig. 10

RESTRAINED CENTER CORE ANISOTROPICALLY CONDUCTIVE ADHESIVE

This invention relates to an anisotropically (Z-axis) conductive film adhesive for use in the assembly and electronic components including, but not limited to, chip and die attach to ceramic and polymeric substrates, printed wiring board (PWB), multi-layer interconnects (MLI); liquid crystal display fabrication, Smart Card® assembly, and layer to layer connection in PWB's and MLI's.

BACKGROUND

The effort to provide more reliable, more cost-effective means for interconnecting microelectronic devices has been underway for at least thirty years. The need for such improvement has become steadily greater because of the long-term trend toward greater circuit density, and the consequent need to reduce the size of bonding pads on a circuit chip, and to narrow the spacing between pads.

The majority of semiconductor devices are assembled with the use of wire bonding to provide ohmic interconnections to the metal pads on the circuit chip. Currently available wire bonders require at least 2 mils spacing from the center of one pad to the center of an adjacent pad. This limitation may block further reductions in the size of a circuit chip, and further increases in circuit density. This and other limitations of wire bonding have been known for several decades; and yet, there is not apparent hope for a break through in wire bonding that would accommodate dramatic reductions in the size and spacing of bonding pads. Patents for anisotropically conductive adhesives extend back to Jun. 5, 1956 with W. Barrows Electrically Conductive Coating, U.S. Pat. No. 2,748,701. Activity in the area of anisotropically conductive adhesives increased in the 1980's with the development of liquid crystal displays and the needs associated for electrical connection of these devices to the support circuitry that make them function. More patents for Z-axis adhesives and materials exist than actual commercially available products (see attached list). The Z-axis materials that are commercially available use either thermoplastic adhesives, unreacted thermosets, or partially reacted thermoset adhesives as the insulating media to separate the metallic conductors, but do not combine these materials into discreet layers. The density of the interconnects to be made are a function of the size of the metallic conductors used in the adhesive and the ability to keep these conductors isolated from one another.

U.S. application Ser. No. 08/719,052 filed Sep. 24, 1996 discloses the interconnection of microelectronic parts by means of multiple, discrete, conductive nanoscopic fibrils or tubules fixed within the pores of an insulating film.

SUMMARY OF THE INVENTION

The proposed material comprises a combination of z-axis conductors, microscopic wires with diameters ranging from $1 \times 10^{-7}$ m to $1 \times 10^{-5}$ m that are much smaller than those offered by other anisotropically conductive adhesives, a center restraining core (either cured thermoset or thermoplastic materials such as, but not limited to polyesters, polyimides, polyetherimides) that will securely hold and isolate the conductors, and layers of thermoset adhesive on one or both sides of the restraining core. The density of the microscopic wires, between a minimum of $5 \times 10^4$ wires/cm$^2$ to a maximum of $1 \times 10^{11}$ wires/cm$^2$. The microscopic wires will be oriented so that they extend from one surface of the film to the opposite surface, forming a continuous electrical path from one side of the combined film/adhesive to the other. This structure will result in an anisotropically electrically conductive film in the z-axis, which is electrically insulating in the X and Y-axes. The combination of a center restraining core with discreet adhesive layers, and microscopic wires at the stated densities are the main difference as compared to other anisotropically conductive adhesives. Additionally, the use of both thermal set adhesive and a center restraining (can be thermoset or thermoplastic materials) allows one to tailor the bonding conditions and accommodate larger variations in flatness than existing anisotropically conductive adhesives. This approach offers the benefit of being able to create a variety of densities of interconnects and bond thickness independent of each other. The bond line thickness is not a function of a conductor size, as with anisotropically conductive adhesives that are based on dispersed particles in an adhesive.

One aspect of the invention is embodied in an assembly of two or more microelectronic parts, wherein electrical interconnection between the parts is achieved by means of multiple, discrete, conductive microscopic fibrils or tubules fixed within the pores of a modified insulating film. The pores are usually perpendicular, or substantially perpendicular to the plane of the film, and extend through the complete thickness of the film. Such a film is said to have anisotropic electrical conductivity, i.e., Z-axis conductivity, with little or not conductivity in the other directions.

The insulating film of the assembly includes three or more layers, selected from various synthetic resin films, also known as polymeric membranes. The central layer constitutes the major portion (60–90%) of the film thickness, and comprises a relatively rigid polymer, while the second and third, less rigid layers are located on the opposite surfaces of the central layer, respectively. By resisting deformation, the central layer holds the conductive fibrils or tubules in a relatively fixed position, while the outer layers are selected for the purpose of improving adhesion or bonding to the interconnected parts. The three-layer film thereby provides a better overall combination of properties than any single-layer film.

In addition to electrical connection, such films are also capable of providing structural connection between parts, for example, by adhesively bonding the parts together, and thereby permanently fixing the tips of the metal fibrils in contact with the parts. Alternatively, the parts may be held together with a non-bonding Z-axis film in between, by pressure alone, using a suitable clamping mechanism. Such an alternative allows the parts to be readily separated for the purpose of replacement or repair.

Single integrated circuit chips having more than one thousand bond pads, for example, are already in production. Interconnection to a ceramic carrier or interposer could readily be made with the invention. Also, two or more chips would be readily interconnected to one another in accordance to the invention. Or, one or more chips comprising active components may be mounted upon and interconnected with ohmic contacts on a passive substrate, a printed wiring board, thin film network, or a package base. In addition to chip interconnect, ohmic interconnection between the layers within a printed wiring board (PWB) or multi-layered interconnect (MLI), could be afforded using the invention. Such permutations and combinations are virtually endless; all of which are included within the scope of the invention.

One example of a suitable Z-axis conductive film useful in accordance with the invention is a three-layer synthetic resin membrane having micrometer sized pores extending through the film, from one membrane surface to the other surface, and having at least some of its pores filled with a conductive material or composition, such as gold or solder. The thickness of the film is within the range of 5 microns, up to 250 microns. The dimensions of the film and the density of the metal fibrils ensure low Ohm resistance and good radio frequency (Rf) performance up to 50 Ghz.

The pore diameter in such a membrane is much smaller than the smallest spacing between contact pads on a circuit chip; and therefore no electrical shorting between adjacent contact can be caused by such metal-filled pores. For purposes of this disclosure, the terms "microscopic", "microporous" and "micrometer-sized" include diameters within the range of about 0.1 micron, up to about 10 microns, and preferably from 0.5 micron t 5.0 microns.

For example, on a chip having one thousand contact pads, a suitable spacing between pad centers is about 0.5 mil, or about 12.5 microns. Thus, the tip of a metal fibril fixed within a pore having a 1 micron diameter covers or contacts only $\frac{1}{12}^{th}$ of the distance between pad centers. For pads having a width of 0.2 mil, and a center-to-center spacing of 0.3 mil, the space between edges of adjacent pads is 0.1 mil. Such a metal fibril tip would contact less than one-half the space between pad edges.

A distinguishing feature of the preferred microporous films used in accordance with the invention is the aspect ratio of the pores. That is, for a one-mil-thick film, each pore length is one mil, or about 25 microns; and thus, for a pore diameter of 1 micron, the aspect ratio is 25:1. The range of suitable aspect ratios for use in the invention is from about 3:1 up to about 200:1, and preferably from about 5:1 to about 100:1.

A further advantage of the invention lies in the fact that precise alignment of the interconnect film with other parts is not required, in order to achieve a desired ohmic interconnection. Acceptable alignment is achieved when some portion of each pad on a chip is aligned with some portion of its counterpart on a substrate or other part to which bonding is desired, provided no overlap with an adjacent pad is allowed.

Microporous single-layer films of the type used in practicing the invention are commercially available for use as microfiltration membranes. They are made, for example, by exposing a nonporous resin film to accelerated nuclear particles having sufficient energy to pass through the entire thickness of the film, followed by selective chemical etching to remove the particle-damaged tracks, and thereby create micropores through the complete thickness of the film. The etching step may also remove small amounts of the surrounding undamaged film.

Such methods have produced films having pores as small as 100 nanometers in diameter, and pore densities approaching 10 million pores per square centimeter. Polycarbonate and polyester resin films having such pore specifications are available from Nuclepore, Inc., and from Poretics Corp. One example is the polycarbonate screen membrane from Poretics, Catalog No. 19368PCTE.

If desired, the membrane is then exposed to an etchant that does not attack the metal, so that a small amount of the membrane surface surrounding the tips of the metal fibrils is removed, thereby providing tips that extend slightly above the remaining membrane surface. The exposed tips may then be tinned with solder, to achieve solder contact with the pads of a circuit chip or substrate, etc., if desired. It has been demonstrated, however, that reliable electrical interconnection is achieved by contact along, without solder bonding or any other form of fixed attachment to the tips of the metal microfibrils used in accordance with the invention.

Methods for plating and filling the inside of such pores have been developed by Dr. Charles R. Martin et al, as reported in the following articles:

"Nanomaterials: A Membrane-Based Synthetic Approach", Science, Vol. 266, pages 1961–6, Dec. 23, 1994

"Template Synthesis of Metal Microtubule Ensembles utilizing Chemical, Electrochemical, and Vacuum Deposition Techniques", J. Mater, Res., Vol. 9, No. 5, Pages 1174–83, May 1994

"Fabrication and Evaluation of nanoelectrode Ensembles" Analytical Chemistry, Apr. 15, 1995

"Metal Nanotubule membranes With Electrochemically Switchable Ion-Transport Selectivity", Science, Vol. 268, May 5, 1995

"Preparation and Electrochemical Characterization of Ultramicroelectrode Ensembles", Analytical chemistry, Vol. 59, No. 21, Pages 2625–30, Nov. 1, 1987

Each of the above-cited articles is incorporated herein by reference. A copy of each article is included herewith.

The use of single nuclear particle guns, lasers, x-rays or electron beams to generate the damage tracks or holes allows convenient patterning of the pore locations. For example, the pores may be arranged in a rectangular or triangular pattern; and moreover, selective areas without pores may be provided so that non-conductive patterns may be fabricated in the membranes, combined with z-axis conduction in other areas of the same membrane. The same result can be achieved, beginning with a random distribution of pores, by selectively masking portions of the membrane surface during etching or plating.

Polymeric central layer membranes used in accordance with the invention include both thermoplastic and thermosetting polymer films selected to provide and retain sufficient rigidity at the temperatures required for bonding of the outer layers to the interconnected parts.

The outer layers are preferably thermosetting polymer resins, selected to ensure that the temperatures required for cure and bonding of the outer layers do not cause a significant softening of the central layers, or damage to the electronic devices. For example, upon heating the combination of an electronic device in contact with a metal-filled, microporous three-layer polymeric membrane, the curing of the outer layers causes an adhesive bonding of the device to the membrane, thereby holding the tips of the metal fibrils in contact with the device.

For most applications, an adhesive outer layer composition is preferred. The surface of such a film will conform completely to the microscopic irregularities of a circuit surface, and thereby permit maximum contact area between each film surface and each circuit or substrate surface. Such a film interface also causes virtually all the metal fibril tips to make good contact with the circuit surface, including each bonding pad, on both sides of the film. The net result is a very low resistance interconnection.

For example, in a membrane having a high pore density, the filled pores represent more than 15% of the composite film volume. Thus, at least 15% of each bonding pad area is contacted with metal, which ensures a very low resistance connection.

The restrained center core anisotropically conductive adhesive is made using a combination of materials and processes. Track and etch technology commonly used for the commercial fabrication of track and etch membranes (can supply references) such as used Poretics, Nanopore, and GSI will be used to produce membranes (including but not limited to PET polyesters, PEN polyesters, polyimides, and polyetherimides) with pores ranging in diameter from $1 \times 10^{-7}$ m to $1 \times 10^{-5}$ m the density of these pores can be varied from a minimum of $5 \times 10^4$ pores/cm$^2$ to a maximum of $1 \times 10^{11}$ pore/cm$^2$, with optimum usefulness being targeted between $1 \times 10^5$ pore/cm$^2$ and $5 \times 10^6$ pore/cm$^2$. Electroless and/or electrolytic plating will be used to fill the pores of the membrane with an electrically conductive metal or metal alloys (gold, copper, nickel, lead tin, gold tin etc.) to form the microscopic wires. The outer $5-10 \times 10^{-6}$ of the microscopic wires will be exposed by removing the outer surfaces of the membrane. The removal of the outer surfaces of the membrane will be accomplished by dry etch processing (reactive ion etch or ashering), or chemical dissolution of polycarbonate plys which were laminated to the restraining core prior to track and etch processing. Thermoset adhesives (including, but not limited to, thermoset epoxies, cyanate esters, pressure sensitive adhesive, and thermoset-thermoplastic-thermoplastic blends) will be applied to the wire filled restraining core.

LIST OF POSSIBLE MATERIALS

The selection of material combinations to form this new anisotropically conductive adhesive with discreet adhesive and restraining layers, with microscopic wires is almost endless. Selection of the restraining core material is best served using materials with low coefficients of thermal expansion, low moisture absorption, and be capable of withstanding the processing of needed to form the microscopic pores and fill the pores with an electrically conductive material to form the microscopic wires. Materials used in the fabrication of flexible circuitry have been chosen as the restraining core. These materials include, but are not limited to, polyethylene naphthalate (PEN) polyesters, polyethylene terephthalate (PET) polyester, polyetherimides (PEI), polyimides and polyamide-imides. Some specific trade names of suitable restraining core materials are:

| Material Name | Type | Supplier | Tg (C.°) | Comment |
| --- | --- | --- | --- | --- |
| Films for Restraining Core | | | | |
| Kaladex 1030 | PEN Polyester | ICI | 120 | Thermoplastic film used for flex circuitry |
| Kaladex 2000 | PEN Polyester | ICI | 120 | Thermoplastic film sued for flex circuitry |
| Melinex ST507 | PET Polyester | ICI | 70 | Thermoplastic film used for flex circuitry |
| Melinex S | PET Polyester | ICI | 70 | Thermoplastic film used for flex circuitry |
| Kapton HN & VN | PI Polyimide | Du Pont | NA | Thermoset film used for flex circuitry (continuous use above 300° C.) |
| Ultem 5000 | PEI Polyether Imide | General Electric | 180 | Thermoplastic film used for flex circuitry |
| Regulus | PI Polyimide | Mitsui Toatsu Chemicals | 240 | Thermoplastic film used for flex circuitry |
| PIBO | PI Polyimide | Dow Chemical | NA | Thermoset film used for flex circuitry (continuous use above 300° C.) |
| Films for Use as Outer Plys in Three Ply Construction | | | | |
| Calibre Films | Polycarbonate | Dow Chemical | 180 | Thermoplastic film used for a variet of products |
| Lexan Films | Polycarbonate | General Electric | 180 | Thermoplastic film used for a variety of products |
| Makrolon and KG films | Polycarbonate | Bayer | 180 | Thermoplastic film used for a variety of products |
| Adhesives for Use With Restraining Core | | | | |
| Ciba 5097 | Epoxy | Ciba | 125 | Sprayable epoxy |
| Epon 58005 | Epoxy | Shell | 125 | Sprayable epoxy |
| RE4183/HD 0243 | Epoxy | Dexter | 132 | Sprayable epoxy |

BRIEF DESCRIPTION OF THE DRAWINGS

FIG. 1 is a greatly enlarged cross-sectional view of a prior anisotropically conductive microelectronic connection, using a polymeric adhesive film having 40-micron metal spheres distributed therein.

FIG. 2 is a greatly enlarged cross-sectional view of a micro-electronic connection interface in accordance with the invention, using a microporous polymeric Z-axis conductive film having a 5-micron diameter gold fibril fixed within each film pore.

FIG. 3 is a greatly enlarged cross sectional view of a micro-electronic connection interface in accordance with the invention, using a nanoporous polymeric Z-axis conductive film having a 0.375-micron diameter gold fibril fixed within each film pore.

FIG. 4 is a greatly enlarged cross-sectional view of a micro-electronic connection interface in accordance with the invention, using a nanoporous polymeric Z-axis film having a 25-nanometer diameter gold fibril fixed within each pore.

FIG. 5 is a greatly enlarged cross-sectional view of plural microelectronic interconnections in accordance with the present invention, using a nanoporous polymeric Z-axis film having a 2-micrometer gold fibril within each pore.

FIG. 6 is a cross-sectional view of a nanoporous resin film.

FIG. 7 is a top view of a package base and an integrated circuit chip to be mounted therein according to the invention.

FIG. 8 is a cross-sectional view of two circuit chips, interconnected with each other in accordance with the invention.

FIG. 9 is a cross-sectional expanded view of an assembly comprising a plurality of printed circuit boards interconnected with the Z-axis film of the invention.

FIG. 10 is a perspective view of a Z-axis conductive film, used to form interconnections in accordance with the invention, with selective non-conductive areas.

DETAILED DESCRIPTION OF THE DRAWING

Figure 11A:
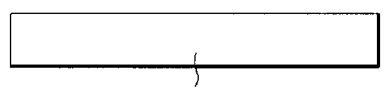
FIGS. 11a–11f are cross-sectional views of a three-layer membrane film, at various stages of fabrication.

FIG. 1 is a greatly enlarged cross sectional view of a Z-axis material containing 40-micron metallic spheres. With this configuration, the bond line is controlled by the size of the sphere. The density and size of pads which can be connected are also controlled by the size of the sphere. To interconnect a higher density circuit, i.e. one with smaller pads, smaller and smaller spheres must be used. The bond line decreases to a point of being non-functional.

As shown in FIG. 2, one embodiment of the present invention includes the use of 5-micron diameter metal fibrils 15 within each pore of film 16, such that multiple fibril tips make contact with pad 17. Although a single fibril tip may not provide substantially more surface contact area with the pad than sphere 11, the key difference is that 230 fibril tips will fit within the same pad area that accommodates only three of the spheres. Thus, the total resistance of the contact in FIG. 2 is substantially less than the total resistance of the contact in FIG. 1; and may be only $\frac{1}{50}^{th}$ of $\frac{1}{100}^{th}$ as great.

As shown in FIG. 3, another embodiment of the invention includes the use of 0.375-micron diameter metal fibrils 21 within the pores of film 22, for making electrical contact with pad 23. Even though each fibril may contact only a single point on pad 23, the number of fibril tips that contact a single pad exceeds 40,000. Thus, the total resistance of the contact in FIG. 2 is much greater than the total resistance of the contact in FIG. 3.

As shown in FIG. 4, nanoscopic metal fibrils 26 within polymer film 27 have a diameter of only 25 nanometers, such that the tips are readily capable of entering the valleys 27 in the surface of pad 28. Theoretically, this should provide an even lower resistance contact than the embodiment of FIG. 3, comparable with the resistance characteristic of an alloyed wire bond.

Still further, the dynamic thickness range of the film is greater, due to the greater aspect ratio of the film pores, and the greater degree of deformation of the metal fibrils in the pores. But the fibril diameters shown in FIG. 4 are not within the scope of the invention, because the degree of deformation of such metal fibrils is considered too great.

As shown in FIG. 5, the film used in accordance with the invention is capable of deforming under pressure to fill the entire space between circuit parts, without causing excess fibril deformation. Thus microscopic fibrils 31 are deformed slightly, as a result of film compression between pads 32 and 33. Similarly, fibrils 34 deform, as a result of film compression between pads 35 and 36.

As shown in FIG. 6, an example of the interconnection means of the invention comprises a three-layer synthetic resin membrane 41 having a central polymer layer one mil thick, and outer surface layers of polycarbonate 0.2 mil thick. The membrane has up to one million or more parallel microscopic pores 42, each pore having a diameter of about 1 micron, at least some of which are filled with gold fibrils 43. Many other three-layer membrane combinations are useful in accordance with the invention, as well as many other dimensional specifications. For electrical conductivity, the gold may be replaced with another metal or other conductive material, including copper, platinum, nickel, and silver, for example.

As shown in FIG. 7, a single circuit chip 44 is inverted within package base 45 such that contact pads on the face of the chip are electrically interconnected with pads 46 of base 45, by means of three-layer membrane 41, separately illustrated in FIG. 6. No alignment of membrane 41 is required, except to cover all of pads 46, since all portions thereof include gold-filled pores. Approximate alignment of the chip is required, only to ensure that some portion of each contact pad is vertically oriented over some portion of the corresponding pad on bas 45. The chip is held in place by the top of the package, (not shown) which is designed to apply pressure to the chip, when the package is fully assembled. Or, the outer layers of membrane 41 are selected to provide permanent bonding of the membrane to both the chip and the package base.

As shown in FIG. 8, two circuit chips 47 and 48 are readily interconnected by means of microporous anisotropically conductive three-layer membrane 49 having at least some of its pores filled with gold or other conductor. The chips are interconnected with substrate 50 by means of microporous anisotropically conductive membrane 51.

As shown in FIG. 9, a plurality of circuit boards 52 having contact pads 53 are readily interconnected by means of Z-axis conductive films 54 and 55, respectively.

As shown in FIG. 10, Z-axis film 56 includes a large number of metal-filled pores 57, and a substantial area 58 without pores, achieved by masking the area using the pore-forming procedure.

Figure 11B:
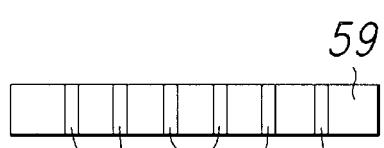
Figure 11C:
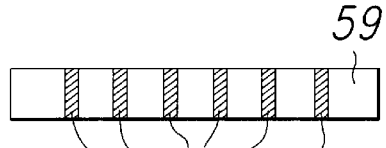
Figure 11D:
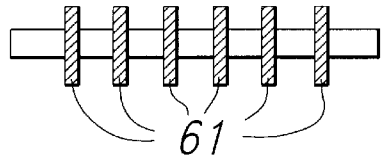
Figure 11E:
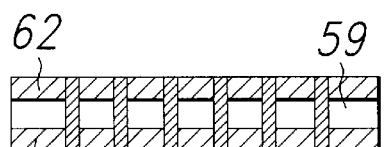
Figure 12E:
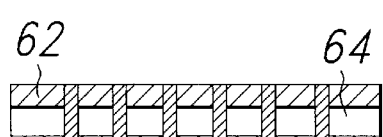
Figure 11F:
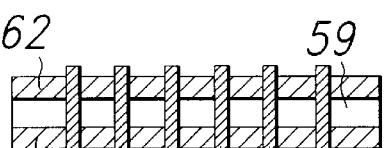
Figure 12F:
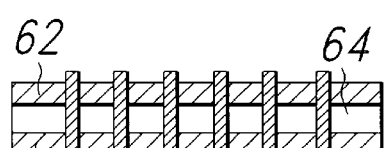

One method for fabrication of the three-layer film of the invention begins with the tracking and etching of a single-layer film consisting of central restraining core polymer 59 as shown in FIG. 11a, to provide micropores 60 in the film, as shown in FIG. 11b. Pores 60 are then filled with meal fibrils 61 as shown in FIG. 11c. Both sides of the film are then etched back to expose the ends of the metal fibrils, as shown in FIG. 11d. Thermosetting polymer film layers 62 and 63, suitable for bonding, are then deposited on both sides of the film to form the structure of FIG. 11e. Finally, if needed, layers 62 and 63 are thinned by etching to expose the tips of fibrils 61, as shown in FIG. 11f. When the film is placed in contact with devices or circuit boards to be interconnected, the combination is heated to curing temperature for the thermosetting layers 62 and 63, whereby the bonding action is completed.

Figure 12A:
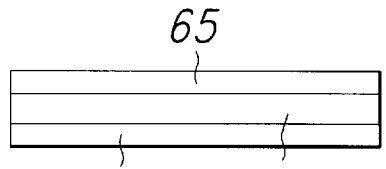
FIGS. 12a–12f are cross-sectional views of a three-layer film, illustrating an alternate method of fabrication.
Figure 12B:
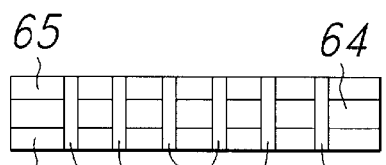
Figure 12C:
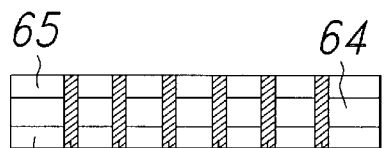

Another method for fabrication of the three-layer film of the invention begins with the tracking and etching of a different three-layer film as shown in FIG. 12a. That is, central restraining layer 64 is comparable to layer 59, but layers 65 and 66 are not comparable to layers 62 and 63. Instead, 65 and 66 are selected for the purpose of being selectively removed from layer 64 after tracking and etching of the composite film to form pores 67 as shown in FIG. 12b, and the subsequent formation of metal fibrils 68 as shown in FIG. 12c. This enables greater control of the thickness and uniformity of the central restraining core layer, as well as greater control over the length of the exposed fibril tips.

Figure 12D:
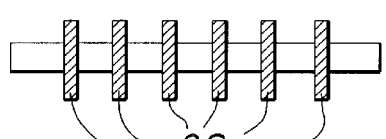

When layers 65 and 66 are etched away, the structure of FIG. 12d remains, which is comparable to the structure of FIG. 11d.

The steps shown in 12e and 12f are also the same as in 11e and 11f.

A specific example of a suitable polymer for central restraining layer 59 or 64 is Kaladex 2000 or Kapton HV 100.

A specific example of a suitable polymer for outer layers 62 and 63, or for layers 116 and 117, is Ciba 5097, Epon 58005, or Ciba 9577.

What is claimed is:

1. A polymeric three-layer membrane having metal-filled microscopic pores extending through the complete thickness thereof, comprising a central restraining core layer, and an adhesive layer on each surface of said core layer.

2. A membrane as in claim 1, wherein the density of said metal-filled pores is between 50,000 pores per square cm and 100 billion pores per square cm.

3. A membrane as in claim 2 wherein each pore has a diameter of 0.1 micron to 10 microns.

4. An assembly, using a membrane as described in claim 1, where ohmic interconnection is made between layers of a printed wiring board or multilayer interconnect.

* * * * *

UNITED STATES PATENT AND TRADEMARK OFFICE
CERTIFICATE OF CORRECTION

PATENT NO. : 6,052,286
DATED : April 18, 2000
INVENTOR(S) : Worthen, et al

It is certified that error appears in the above-identified patent and that said Letters Patent is hereby corrected as shown below:

Title page, insert the following item:
--[60] Provisional application No. 60/043,779 April 11, 1997. --

Column 1, line 4, insert the following:
--CROSS REFERENCE TO RELATED APPLICATION
Reference is made to and priority claimed form U.S. Provisional Application Serial No. 60/043,779, filed April 11, 1997, entitled Restrained Center Core Anisotropically Conductive Adhesive. --

Signed and Sealed this

Thirteenth Day of February, 2001

*Attest:*

NICHOLAS P. GODICI

*Attesting Officer*     *Acting Director of the United States Patent and Trademark Office*